(12) United States Patent
Yoshii et al.

(10) Patent No.: US 8,721,846 B2
(45) Date of Patent: May 13, 2014

(54) METHOD OF FORMING FILM, FILM FORMING APPARATUS AND STORAGE MEDIUM

(75) Inventors: Naoki Yoshii, Nirasaki (JP); Yasuhiko Kojima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1751 days.

(21) Appl. No.: 11/720,461

(22) PCT Filed: Nov. 29, 2005

(86) PCT No.: PCT/JP2005/021890
§ 371 (c)(1),
(2), (4) Date: May 30, 2007

(87) PCT Pub. No.: WO2006/059602
PCT Pub. Date: Jun. 8, 2006

(65) Prior Publication Data
US 2009/0145744 A1 Jun. 11, 2009

(30) Foreign Application Priority Data
Nov. 30, 2004 (JP) ................. 2004-346293

(51) Int. Cl.
| | |
|---|---|
| C23C 14/00 | (2006.01) |
| C23C 14/32 | (2006.01) |
| C25B 9/00 | (2006.01) |
| C25B 11/00 | (2006.01) |
| C25B 13/00 | (2006.01) |
| H01L 21/44 | (2006.01) |
| C23C 14/16 | (2006.01) |
| C23C 10/06 | (2006.01) |
| C23C 14/14 | (2006.01) |
| C23C 26/00 | (2006.01) |
| H01L 21/285 | (2006.01) |
| H01L 21/768 | (2006.01) |
| H01J 37/34 | (2006.01) |
| C23C 14/34 | (2006.01) |
| C23C 10/02 | (2006.01) |

(52) U.S. Cl.
CPC ............ *C23C 14/165* (2013.01); *C23C 10/06* (2013.01); *C23C 14/14* (2013.01); *C23C 26/00* (2013.01); *H01L 21/2855* (2013.01); *H01L 21/28562* (2013.01); *H01L 21/76843* (2013.01); *H01L 21/76856* (2013.01); *H01L 21/28556* (2013.01); *H01J 37/34* (2013.01); *C23C 14/0057* (2013.01); *C23C 14/345* (2013.01); *C23C 10/02* (2013.01)
USPC ........... 204/192.12; 204/192.15; 204/192.25; 204/298.02; 204/298.07; 438/680; 438/681; 438/687

(58) Field of Classification Search
CPC ...... C23C 14/165; C23C 10/06; C23C 26/00; C23C 14/0057; C23C 14/345; C23C 10/02; H01L 21/2855; H01L 21/28562; H01L 21/76843; H01L 21/76856; H01L 21/28556; H01J 37/34
USPC ........... 118/719; 204/192.12, 192.14, 192.17, 204/192.26, 298.26; 427/562, 587
See application file for complete search history.

(56) References Cited

U.S. PATENT DOCUMENTS

| | | | | |
|---|---|---|---|---|
| 4,234,622 | A * | 11/1980 | DuBuske et al. | 427/587 |
| 5,961,793 | A * | 10/1999 | Ngan | 204/192.12 |
| 6,126,792 | A * | 10/2000 | Grunwald et al. | 204/192.14 |
| 6,287,430 | B1 * | 9/2001 | Matsumoto et al. | 204/192.26 |
| 6,596,133 | B1 * | 7/2003 | Moslehi et al. | 204/192.17 |
| 6,858,085 | B1 * | 2/2005 | Nguyen et al. | 118/719 |
| 7,279,201 | B2 * | 10/2007 | Macneil | 427/562 |

FOREIGN PATENT DOCUMENTS

| | | | |
|---|---|---|---|
| JP | 06280009 | A * | 10/1994 |
| JP | 11 176770 | | 7/1999 |
| JP | 2000 277607 | | 10/2000 |
| JP | 2001 152339 | | 6/2001 |
| JP | 2002 38271 | | 2/2002 |

| JP | 2004 47644 | 2/2004 |
| JP | 2004 193552 | 7/2004 |

\* cited by examiner

*Primary Examiner* — Michael Band
(74) *Attorney, Agent, or Firm* — Oblon, Spivak, McClelland, Maier & Neustadt, L.L.P.

(57) ABSTRACT

A film forming method includes mounting a substrate on a mounting member after loading the substrate into a reaction chamber, adsorbing a compound of a first metal on a surface of the substrate by supplying a source gas containing the compound of the first metal into the reaction chamber, reducing the compound of the first metal adsorbed on the substrate by making a reducing gas contact therewith to thereby obtain a first metal layer, and alloying the first metal and a second metal to obtain an alloy layer of the first metal and the second metal by injecting the second metal into the first metal layer. The second metal is ejected from a target electrode facing the substrate by making a sputtering plasma contact with the target electrode, and at least a surface of the target electrode is formed of the second metal different from the first metal.

16 Claims, 6 Drawing Sheets

Ni 0 atom%
Rs NOT MEASURABLE
XRF 455Å
ρs - μΩ·cm
DISCONTINUOUS FILM

Ni 9 atom%
Rs 2.6 Ω/sq
XRF 450Å
ρs 13.3 μΩ·cm

Ni 17 atom%
Rs 3.7 Ω/sq
XRF 423Å
ρs 19.1 μΩ·cm

Ni 36 atom%
Rs 4.4 Ω/sq
XRF 538Å
ρs 30 μΩ·cm

CONTINUOUS FILM

METHOD OF FORMING FILM, FILM FORMING APPARATUS AND STORAGE MEDIUM

FIELD OF THE INVENTION

The present invention relates to a film forming method and a film forming apparatus, each for forming a metal alloy thin film on a substrate, e.g., a semiconductor wafer or the like, and a storage medium for storing therein a program to execute the method.

BACKGROUND OF THE INVENTION

In a conventional semiconductor device such as an integrated circuit (IC) or the like, a wiring is formed on a semiconductor wafer (hereinafter, referred to as "wafer") such as a silicon substrate or the like by burying a metal serving as a conductor in an insulating film such as a silicon oxide film (SiO2 film) or the like. As for a technique for forming the wiring, there is known one for burying a metal as a conductor in a wiring groove formed in an insulating film, e.g., a silicon oxide film or the like, formed on a surface of the silicon substrate and then removing an excess metal film by using a CMP (chemical mechanism polishing) method to thereby flatten a wafer surface. When burying a metal by using a CVD (chemical formed, the wiring groove is filled with a metal same as that forming the seed layer by the electroplating. Thereafter, the CMP process is carried out and, then, further insulating film is formed on the insulating film where the wiring groove has been formed. By repeatedly performing the above-described processes, a multilayer interconnection structure is formed.

Meanwhile, a recent trend of high integration and high speed of semiconductor devices intensifies demands for a reduction of a line width as well as the formation of the multilayer interconnection structure. However, such demands have brought about new tasks. As described above, the sputtering for use in the formation of a seed layer is a technique for ejecting atoms from a bulk metal and then adhering scattered atoms to a substrate surface. Therefore, it is difficult to control a scattering direction of the atoms. In other words, when an aspect ratio of the wiring groove (depth of wiring groove/opening width thereof) increases due to a decrease of the line width, it is difficult for the metal atoms to penetrate into the wiring groove or a via hole easily.

Thus, a step coverage therefor becomes poor and, also, there occur discontinuities in the seed layer. Then, when filling the wiring groove by the aforementioned electroplating or the like, the plated metal does not completely fills the wiring groove, thereby causing voids in vapor deposition) method, the surface becomes rough and an electrical resistance of the wiring may be locally varied. To that end, burying the metal is generally accomplished by using an electroplating method.

To be specific, a barrier layer made of, e.g., titan nitride (TiN) is formed first on a surface of a wiring groove by a CVD method using an ALD (atomic layer deposition) technique, or a PVD (physical vapor deposition) method such as sputtering, or the like. The barrier layer serves to prevent the metal from penetrating into the insulating film (SiO2) when the metal constituting the wiring is buried later. The ALD is a technique for forming a thin film by repeatedly depositing one atomic or molecular layer at a time on a substrate surface and has a high controllability in a film thickness being formed. The sputtering is a technique for depositing metal atoms in a layer on the substrate surface, the metal atoms being ejected, in a similar manner as in the billiards, from a surface of a bulk metal by a collision between high-energy ions such as Ar ions or the like and the bulk metal under a high vacuum condition.

Next, a metal thin film a so called seed layer, is formed as a base layer of an electrode in performing an electroplating on a surface of the barrier layer. Such a seed layer is formed by the sputtering in order to obtain a wiring having a flat surface. After the seed layer is the wiring. The wiring in which the voids exist often causes a stress migration (a movement of metal atoms in the wiring due to a stress developed therein by a thermal expansion coefficient difference between the metal wiring and the insulating film formed therearound) or an electro-migration (a movement of atoms due to collision with electrons by a current flowing in the metal). As a result, the wiring is often cut off.

In order to minimize effects of the stress migration or the electro-migration which are caused by the reduction in the line width, the wiring has recently been often made of Cu (copper) having a high strength and a low electrical resistance compared with Al that has been widely used.

Figure 6A:
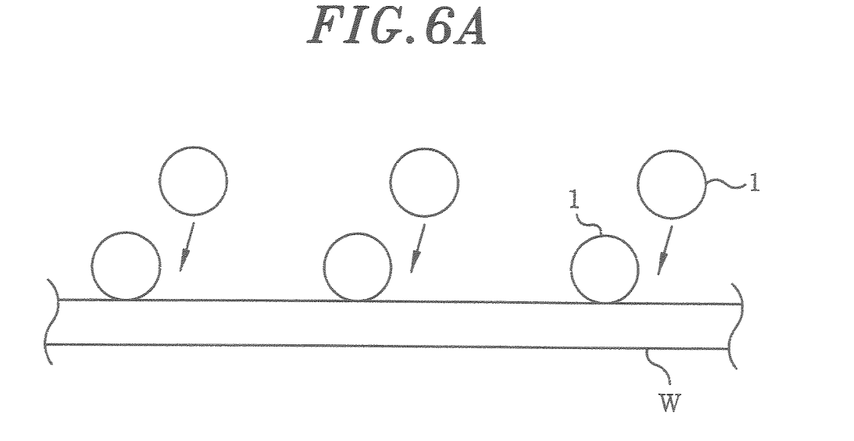
FIGS. 6A to 6C present schematic diagrams showing a movement of Cu atoms in forming a film on a surface of the wafer W by using Cu.
Figure 6B:
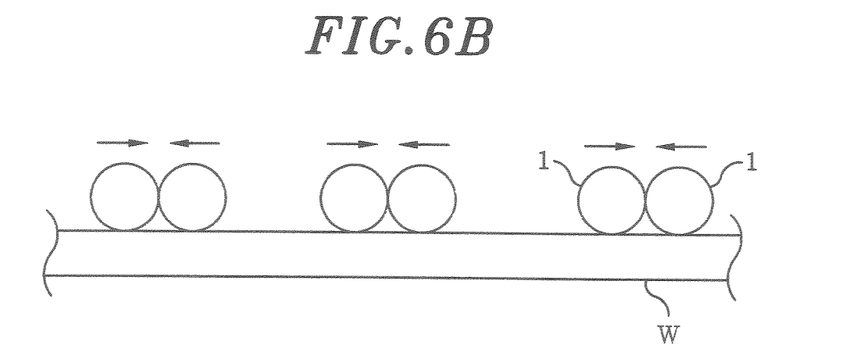
Figure 6C:
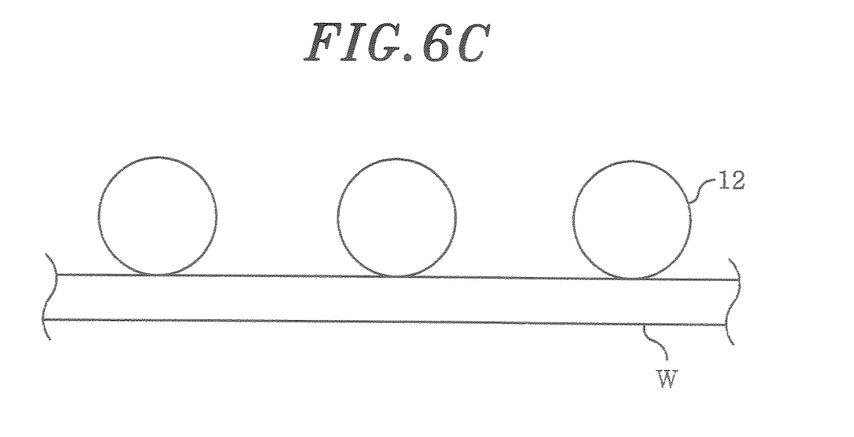

However, Cu has a property in which atoms or molecules are highly cohesive with each other. FIGS. 6A to 6C schematically show movements of Cu atoms 1 in forming a seed layer on a surface of a wafer W by PVD. In an initial stage of the formation of the seed layer, the Cu atoms 1 are sparsely adhered to the surface of the wafer W. However, as the number of the Cu atoms 1 adhered to the surface of the wafer W increases (see, FIG. 6A), the Cu atoms 1 and their neighboring atoms attract each other to coalesce (FIG. 6B). The repeated coalescence of Cu atoms results in a formation and growth of Island-shaped large masses of Cu molecules 12 (FIG. 6C). Due to the development of the island-shaped Cu molecules 12, the discontinuities occur in the seed layer if the amount of Cu supplied to the wafer surface is insufficient. If there exist discontinuities, voids are formed in the wiring when filling the wiring groove by the electroplating or the like as described above, thus often causing cut-offs in the wiring. For such reasons, it is difficult to form a seed layer having a small film thickness in a recess having a high aspect ratio and, therefore resulting in difficulty of reducing a line width.

SUMMARY OF THE INVENTION

Although one object of the present invention is to overcome the drawbacks of the prior art, it also aims to solve a problem that a source gas selection is restricted in view of avoiding a reaction between different sources in forming an alloy thin film by using metal source gases.

It is, therefore, an object of the present invention to provide a technique capable of forming an alloy thin film without considering a combination of metal sources. Further, the present invention also provides a film forming method and apparatus capable of forming a continuous thin film on a surface of a substrate such as a wafer or the like even in case of using a highly cohesive metal and also capable of achieving high coverage in a wiring groove having a high aspect ratio; and a storage medium for storing therein a program to execute the method.

In accordance with one aspect of the invention, there is provided a film forming method, including the steps of: mounting a substrate on a mounting table after loading the substrate into a reaction chamber; adsorbing a compound of a first metal on a surface of the substrate by supplying a source gas containing the compound of the first metal into the reaction chamber; reducing the compound of the first metal adsorbed on the substrate by making a reducing gas contact therewith while supplying energy for a reducing reaction to the compound, to thereby obtain a first metal layer; and alloying the first metal and a second metal to obtain an alloy layer of the first metal and the second metal by injecting the second metal into the first metal layer, the second metal being ejected from a target electrode facing the substrate by making a sputtering plasma contact with the target electrode, the sputtering plasma being obtained by activating a sputtering gas, and at least a surface of the target electrode being formed of the second metal different from the first metal, wherein one or more cycles are performed repeatedly, each cycle including the adsorbing step, the reducing step and the alloying step.

The alloying step may be performed while heating the substrate, so that the second metal could be annealed and diffused via the first metal. However, in the present invention, the annealing step can be carried out after the alloying step by heating the substrate with the use of an additional apparatus. Due to the annealing step, the second metal can be diffused even into a deep portion of a recess having a high aspect ratio. However, the diffusion of the second metal is not necessarily required in the present invention. As for the energy for the reducing reaction supplied to the compound during the reducing step for obtaining the first metal layer, it is preferable to use energy of a reducing plasma obtained by activating the reducing gas. However, the energy can also be thermal energy, light energy or the like. In the aforementioned method, the reducing step and the alloying step can be simultaneously performed after the adsorbing step.

In case of using the reducing plasma, those steps can be performed by generating in the reaction chamber a plasma obtained by combining the reducing plasma with the sputtering plasma. To be specific, the reducing step and the alloying step can be performed by applying a high frequency voltage to a gap between parallel plate electrodes, one electrode serving as a substrate mounting member and the other electrode serving as the target electrode. Further, the present invention may be implemented by pre-coating a second metal layer on the target electrode forming one of the parallel plate electrodes. Moreover, it is preferable that the target electrode serves as a gas supply unit having a plurality of gas supply openings for supplying the source gas, the reducing gas and the sputtering gas into the reaction chamber. As for the reducing gas, there can be used, e.g., H2 gas or NH3 gas. As for the first metal, there can be used, e.g., copper.

In accordance with another aspect of the invention, there is provided a film forming apparatus including: a reaction chamber including a mounting member for mounting thereon a substrate; a heating unit for heating the substrate mounted on the mounting member; a source gas supply unit for supplying a source gas containing a compound of a first metal into the reaction chamber to thereby allow the compound of the first metal to be adsorbed on a surface of the substrate; a reducing gas supply unit for supplying into the reaction chamber a reducing gas for reducing the compound of the first metal; an energy supplying unit for supplying energy for a reducing reaction to the compound of the first metal adsorbed on the substrate; a target electrode facing the substrate, at least a surface of the target electrode being formed of a second metal different from the first metal; a plasma generation unit for forming a sputtering plasma atmosphere in the reaction chamber by activating a sputtering gas, to thereby sputter the target electrode; and a controller for controlling each of the units to execute one or more cycles.

Here, each of the cycles includes the steps of supplying the source gas to the substrate by the source gas supply unit; reducing the compound of the first metal adsorbed on the substrate by using the reducing gas while supplying the energy to the compound; and obtaining an alloy layer of the first metal and the second metal by injecting the second metal into the first metal layer, the second metal being ejected from the target electrode by making the sputtering plasma contact with the target electrode.

As for the energy supplying unit for supplying the energy for the reducing reaction, it is preferable to use a plasma generating unit, a thermal energy generation unit and/or a light energy generation unit, the plasma generating unit being used for forming a reducing plasma atmosphere in the reaction chamber by activating the reducing gas. Further, the reducing plasma and the sputtering plasma can be generated by applying a high frequency voltage to a gap between the parallel plate electrodes, one electrode serving as the mounting member for mounting thereon the substrate, the other electrode serving as the target electrode.

In accordance with still another aspect of the invention, there is provided a storage medium storing therein a computer program, for use with a film forming apparatus for forming a film after loading a substrate into a reaction chamber, to execute any one of the aforementioned methods. To be specific, the computer program has instructions for performing the above-described steps.

In accordance with the present invention, an alloy thin film can be easily formed by adsorbing the first metal on the substrate surface by using the source gas and then adsorbing the second metal thereon by sputtering. The alloy thin film thus formed can be used for forming, e.g., a wiring or the like. In case the alloy thin film is formed in, e.g., the recess, the first metal is adsorbed even on a bottom portion of the recess despite that the recess has a high aspect ratio. Next, the second metal is adsorbed in the recess by the sputtering and then diffused via the first metal due to an annealing performed by heating the substrate. Hence, the alloy thin film can be formed even on the bottom portion of the recess.

This is an improvement over a film forming method using only the sputtering. Even in case the first metal is a metal having a strong aggregation force, e.g., Cu or the like, the first metal forms an alloy with the second metal. Thus, a movement of the first metal on the substrate surface is suppressed and, hence, a metal thin film (alloy thin film) containing the first metal can be formed with a small film thickness.

Accordingly, the present invention can be variously utilized. For example, when a seed layer is formed in a recess in order to form a wiring layer of a semiconductor device by a plating process, the method of the present invention enables a formation of a continuous seed layer having a small film thickness. As a result, when a wiring is formed by performing a plating operation on the seed layer, it is possible to suppress an occurrence of voids in the wiring.

DETAILED DESCRIPTION OF THE EMBODIMENT

Figure 1:
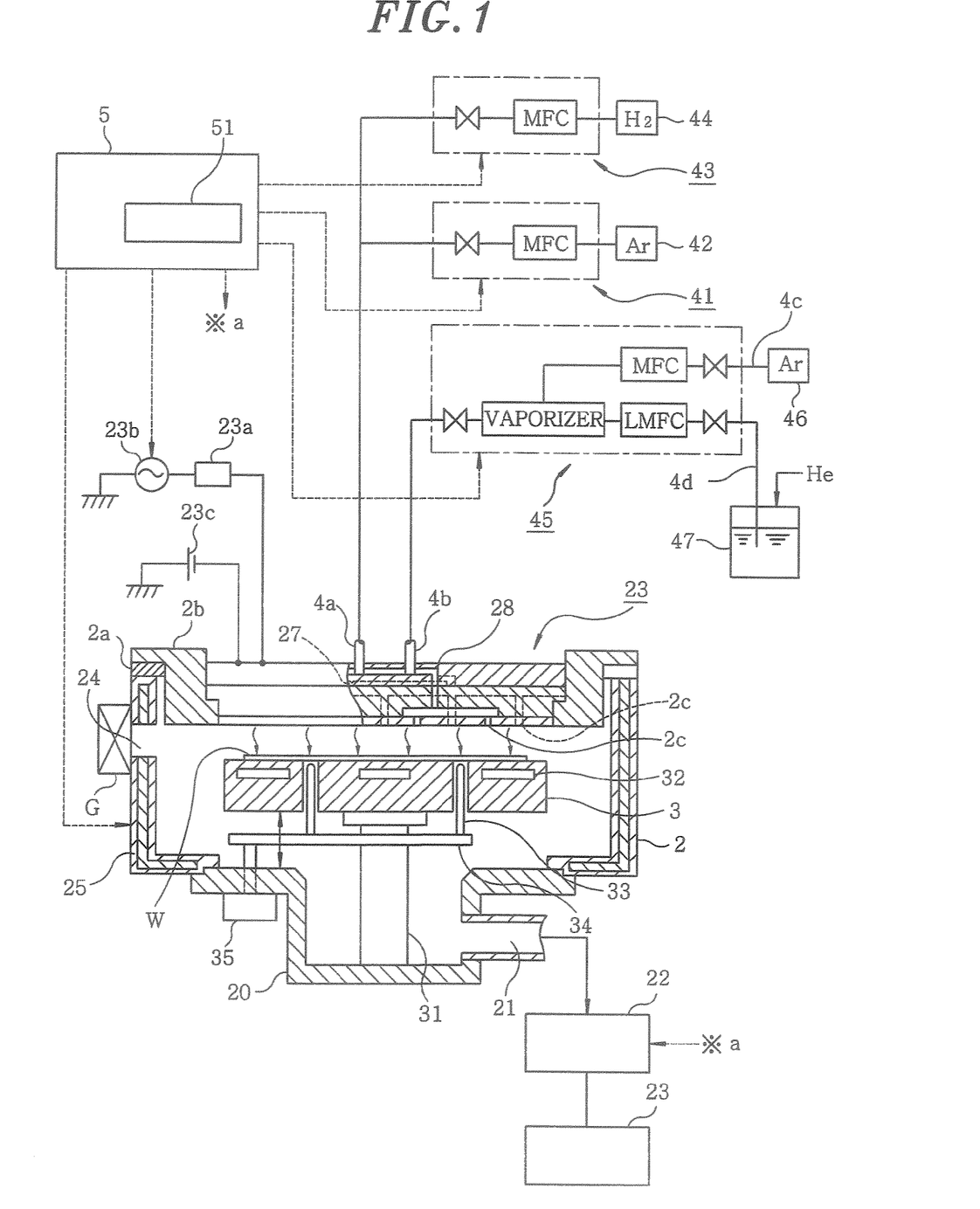
FIG. 1 shows a vertical side view of a film forming apparatus in accordance with one embodiment of the present invention.

FIG. 1 shows an example of a film forming apparatus for performing a film forming method of the present invention. The film forming apparatus of the present invention forms a seed layer made of Cu (copper) on a surface of a wafer W, the wafer W being a target object. First, an entire configuration of the film forming apparatus will be described hereinafter.

As shown in FIG. 1, reference numeral 2 designates a processing chamber, where it has a recess 20 at the center of its bottom surface. A gas exhaust port 21 is formed on a sidewall of the recess 20 and communicates via a pressure control unit 22 with a vacuum pump 23 forming a vacuum exhaust unit together with the pressure control unit 22. Further, the pressure control unit 22 can maintain an inside of the processing chamber 2 at a specific vacuum pressure by, e.g., controlling an opening degree of a valve according to a control signal from a controller 5 to be described later. Moreover, an opening 24 that is openable/closable by a gate valve G is formed on a sidewall of the processing chamber 2 so that a transfer arm (not shown) can be loaded into or unloaded from the processing chamber 2 when transferring the wafer. Buried in a wall of the processing chamber 2 is a heater 25 made of, e.g., a resistance heating element. The amount of heat releasing from the heater 25 is controlled by the controller 5 to be described later.

A mounting table 3 for mounting thereon a substrate is supported via a support 31 in the processing chamber 2. The mounting table 3 is made of, e.g., aluminum, and has a cylindrical shape. The wafer W can be attracted and held on a top surface of the mounting table 3 by a movement of an electrostatic chuck (not illustrated). The mounting table 3 has therein a temperature control unit 32 including a heating unit, e.g., a heater or the like, a coolant path and the like. The wafer W is maintained at a preset temperature by heat generated from a plasma and a temperature control operation of the temperature control unit 32. Further, the mounting table 3 has therein, e.g., three lift pins 33 for transferring the wafer W from/to the transfer arm (not shown). The vertically movable lift pins 33 are moved up and down by a movement of an elevating mechanism 35 via a supporting member 34 for supporting lower portions of the lift pins 33.

A gas shower head 23 serving as a gas supply unit is provided at an inner upper portion of the processing chamber 2 via an insulating member 2a made of, e.g., ceramic or the like, and a support 2b. A first and a second gas supply line 4a and 4b are connected with a ceiling portion of the gas shower head 23 and, also, a plurality of gas supply openings 2c are formed on a bottom surface of the gas shower head 23. Accordingly, the gases from the first and the second gas supply line 4a and 4b are separately supplied to the processing atmosphere via respective gas channels 27 and 28, respectively, while being scattered through the gas supply openings 2c without being mixed with each other.

Figure 2:
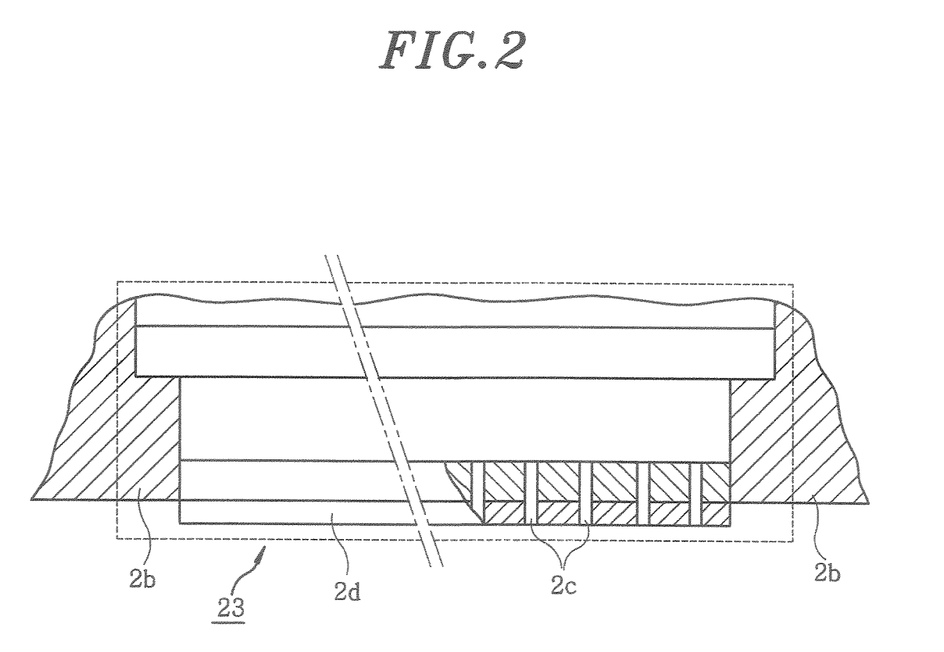
FIG. 2 describes an enlarged view of a shower head forming the film forming apparatus.

A high frequency power supply 23b is connected with the gas shower head 23 via a matching unit 23a. Further, the high frequency power supply 23b is connected with the controller 5 to be described later, so that a power thereof is controlled based on a control signal from the controller 5. Since the mounting table 3 is grounded, a processing gas can be converted into a plasma by a high frequency voltage applied from a matching unit 23b to a gap between the gas shower head 23 and the mounting table 3. In this example, the high frequency power supply 23b and the matching unit 23a correspond to a plasma generation unit for generating a reducing plasma and that for generating a sputtering plasma, respectively. FIG. 2 is an enlarged view of the gas shower head 23. A coating layer 2d pre-coated with a second metal, e.g., Ni (nickel), is formed on a bottom surface of the gas shower head 23 which faces the mounting table 3. The pre-coated process refers to a treatment in which a required metal is pre-coated by a CVD method, an ALD method, a plating method, a thermal spraying method or the like. As described above, when the power is supplied to the gas shower head 23, the coating layer 2d serves as a target electrode (cathode) in performing a sputtering in the processing chamber 2. As indicated by a dashed line in FIG. 1, a negative DC power supply 23c in addition to the high frequency power supply 23b may apply a power to the target electrode to thereby enhance a function of the cathode.

The following is a further description of a gas supply system. An upstream side of the first gas supply line 4a connected with the ceiling portion of the gas shower head 23 is branched in the middle thereof. One end of the first gas supply line 4a is connected via a gas supply kit 41 with a gas supply source 42 for supplying Ar gas for sputtering. The other end of the first gas supply line 4a is connected via a gas supply kit 43 with a gas supply source 44 for supplying H2 gas to reduce a compound of the first metal. Each of the gas supply kits 41 and 43 has therein a valve, a mass flow controller (hereinafter, referred to as "MFC"), etc. A supply/stoppage of Ar gas and H2 gas from the gas supply sources 42 and 44, respectively, and flow rates thereof are controlled based on the control signal from the controller 5. Moreover, as for the reducing gas, NH3 (ammonia), N2H4 (hydrazine), NH(CH3)2 (dimetylamine), N2O (dinitrogen monoxide) or the like may also be used instead of being limited to the H2 gas. In this example, the gas supply kit 43 and the gas shower head 23 correspond to a reducing gas supply unit.

An upstream side of the second gas supply line 4b connected with the ceiling portion of the gas shower head 23 is connected with a gas supply kit 45. The gas supply kit 45 is connected via a gas supply line 4c with a carrier gas supply unit 46 for supplying a carrier gas such as Ar or the like and also connected via a liquid source supply line 4d with a liquid source supply tank 47 for supplying a liquid source.

The liquid source supply tank 47 stores therein a liquid compound of the first metal, i.e., Bis(6-ethyl-2,2-dimethyl-3,5-decanedionato) copper (hereinafter, referred to as "Cu(edmdd)2"). The gas supply kit 45 has therein, e.g., a vaporizer, a liquid mass flow controller (LMFC), a gas mass flow controller (MFC), a valve and the like. Each unit of the gas supply kit 45 is controlled by the controller 5 to be described later. As for a compound of Cu as the first metal, there may be used Cu(hfac)2, a metal compound of Cu similar to Cu(hfac)2 and a β-diketone-based compound, a carboxylic acid complex such as Cu(CH3COO)2, Cu(CF3COO)2 or the like, instead of Cu(edmdd)2. In this example, the gas supply kit 45 and the liquid source supply tank 47 correspond to a liquid gas supply unit.

The film forming apparatus of the present invention includes the controller 5 configured with, e.g., a computer. The controller 5 has a program 51, a memory, a data processing unit formed of a CPU, and the like. The program 51 includes commands for forming a seed layer. The formation of the seed layer will be described in the next explanation of an operation of the apparatus. Further, the memory has a region for storing values of process parameters such as processing pressure, processing time, gas flow rates, power values and the like. When the CPU executes each of the commands of the program 51, the process parameters are read and, then, the control signals according to the parameter values are sent to each unit. The program (including a program for inputting the process parameters from a screen) is stored in a storage medium such as a flexible disk, a compact disk an MO (magneto-optical disk) or the like and gets installed in the controller 5.

Figure 3A:
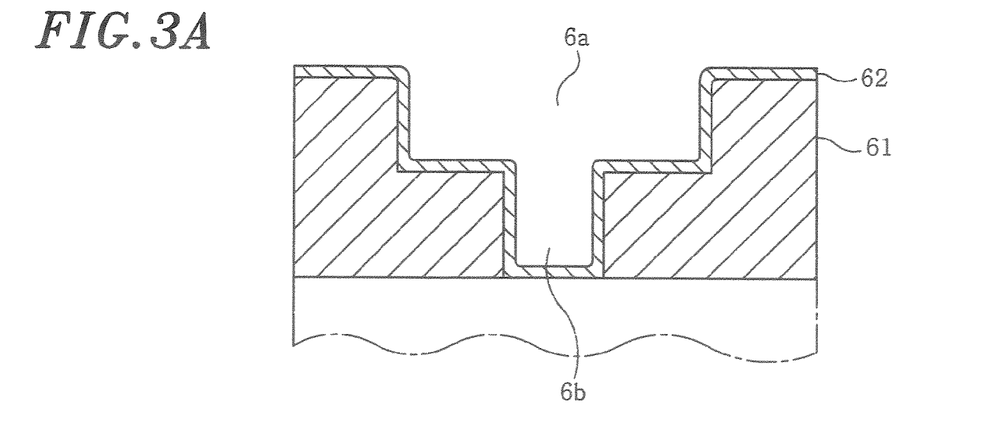
FIGS. 3A to 3C illustrate processes for forming a wiring on a wiring groove and a via hole formed on a surface of the wafer W by using the film forming apparatus.

FIGS. 3A to 3C and 4A to 4D illustrate processes for forming a seed layer made of Cu and Ni (nickel in a recess including a wiring groove and a via hole on a surface of the wafer W and those for forming a wiring by the above-described apparatus. First, a state of the wafer W that has not yet been subjected to a treatment of the corresponding apparatus will be described. In order to form an additional wiring layer on a wiring layer that is a part of a semiconductor integrated circuit, as shown in FIG. 3A, an insulating film 61 such as SiO2 or the like is formed on a surface of the wafer W and, also, a wiring groove 6a and a via hole 6b are formed in the insulating film. Further, the surface of the wafer W on which the recess including the wiring groove 6a and the via hole 6b is formed is coated with a barrier layer 62 made of, e.g., TiN.

In the aforementioned apparatus, the gate valve G is opened and, then, the wafer W is horizontally mounted on the mounting table 3 after being loaded into the processing chamber 2 by a transfer arm (not shown). Then, when the transfer arm is retracted from the processing chamber 2, the gate valve G is closed. Next, the inside of the processing chamber 2 is evacuated by a vacuum pump 23 through the gas exhaust port 21, so that the pressure inside the processing chamber 2 is maintained at, e.g., about 133 Pa (1 Torr). At this time, a surface of the mounting table 3 is heated to a process temperature, e.g., about 150° C., by the temperature control unit 32 and, also, a temperature inside the processing chamber 2 is maintained within the range of, e.g., about 50° C. to about 120° C., by the heater 25. Thereafter, the following steps are performed.

(Step 1: Source Supply to the Inside of the Processing Chamber 2)

Figure 4A:
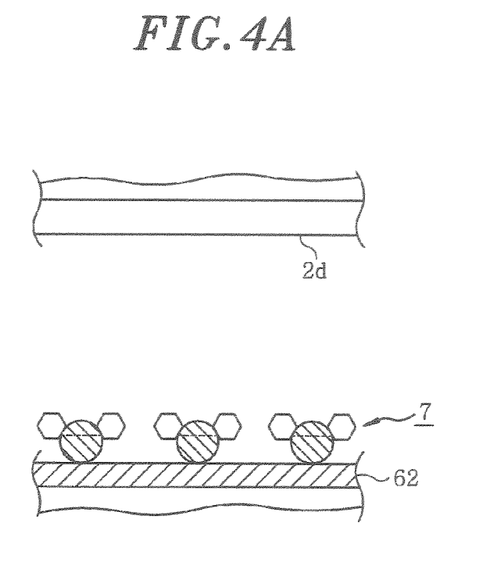
FIGS. 4A to 4D are schematic diagrams depicting processes for forming a seed layer in forming the wiring.

When He gas is supplied to the liquid source supply tank 47, a source formed of Cu(edmdd)2 stored in the liquid source supply tank 47 is supplied to the gas supply kit 45 at a flow rate of, e.g., about 0.05 ml/sec to 3 ml/sec. The Cu(edmdd)2 is vaporized into a source gas in the gas supply kit 45, and this vaporized source gas is supplied together with a carrier gas to the processing chamber 2 via the gas supply line 4b and the gas shower head 23. As schematically shown in FIG. 4A, Cu(edmdd)2 molecules 7 in the processing gas, which are supplied into the processing chamber 2, are adsorbed on the surface of the barrier layer 62 of the wafer W that has been heated to, e.g., about 140° C., thereby forming a molecular layer having a thickness of, e.g., several molecules to several tens of molecules.

(Step 2: Purge and Exhaust in the Processing Chamber)

After the supply of the Cu(edmdd)2 gas to the processing chamber 2 is stopped the inside of the processing chamber 2 is evacuated while supplying thereto a purge gas, e.g., Ar gas. Next, supplying of the purge gas is stopped and, then, the inside of the processing chamber 2 is completely exhausted by fully opening the pressure control unit 22 configured as, e.g., a butterfly valve. In this manner, the Cu(edmdd)2 gas that has not been adsorbed on the barrier layer 62 is removed from the processing chamber 2. Since the source gas is pushed out of the processing chamber 2 by the purge gas, the supply of the purge gas improves exhaust efficiency.

(Step 3: Source Reduction and Sputtering)

Figure 4B:
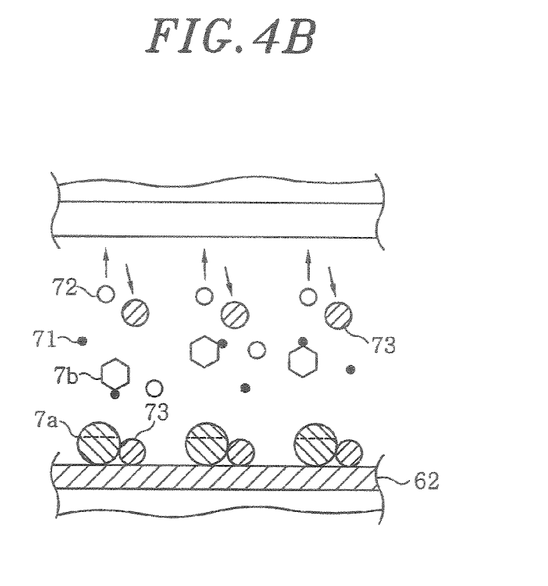
Figure 4C:
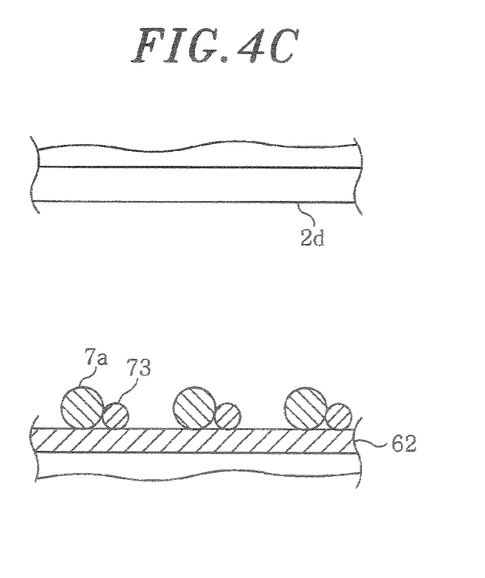

H2 gas from the gas supply source 44 and Ar gas from the gas supply source 42 are supplied to the processing chamber 2 via the gas supply line 4a and the gas shower head 23. When the high frequency voltage is applied from the high frequency power supply 23b to the gap between the gas shower head 23 serving as an upper electrode and the mounting table 3 serving as a lower electrode, Ar gas as a sputtering gas is converted (activated) into a sputtering plasma, whereas H2 gas as a reducing gas is converted into a reducing plasma. FIG. 4B schematically describes a reaction taking place in the processing chamber 2 having the plasma generated therein. The Cu(edmdd)2 molecules 7 adsorbed on the surface of the barrier layer 62 are reduced by a reaction with active species, e.g., hydrogen ions 71 or hydrogen radicals (not shown) in the plasma. As a consequence, Cu atoms 7a remain on the surface of the barrier layer 62, whereas edmdd atoms 7b ejected from the Cu(edmdd)2 molecules 7 get evaporated in the processing chamber 2. That is, the Cu(edmdd)2 molecules 7 are reduced by H2 gas serving as a reducing gas and plasma energy supplied to a reactant (the reactant being H2 gas in this example).

Meanwhile, Ni atoms 73 forming the coating layer 2d are sputtered by Ar+ ions 72 which collide with the coating layer 2d of the gas shower head 23. The sputtered Ni atoms 73 are injected into a Cu layer and then get solidified or combined with the Cu atoms 7a, thus forming an alloy. In case the recess on which a seed layer will be formed has a high aspect ratio, the Ni atoms 73 may not reach the inside of the recess thoroughly. Since, however, the wafer W is heated, the Ni atoms are annealed and diffused via a surface of the Cu layer. As a consequence, the Ni atoms are injected into the Cu layer so that they can reach a deep portion of the recess. When the Ni atoms 73 collide either with the Cu(edmdd)2 molecules 7 or with the Cu atoms 7a reduced from the Cu(edmdd)2 molecules 7, the amount of the sputtered Ni atoms 73 is small.

Therefore, the Cu(edmdd)2 molecules 7 are allowed to be reduced by the hydrogen plasma and, accordingly, the Ni atoms 73 and the Cu atoms 7a are combined or solidified with each other. Hence, the reduction process of the Cu(edmdd)2 molecules 7 and the Ni sputtering process may not be performed simultaneously and can be consecutively performed. In other words, a reaction is performed by a plasma generated in the processing chamber 2 by supplying thereto either H2 gas or Ar gas and, then, another reaction is performed by a plasma generated in the processing chamber 2 by supplying thereto a gas that has not been used in the previous reaction. Besides, the reducing gas and the sputtering gas may be the same. For example, when H2 gas is used as the reducing gas as well as the sputtering gas and, also the power of the high frequency power supply 23b increases, it is possible to simultaneously perform the process for reducing the adsorbed source gas by using a plasma generated from H2 gas and the process for sputtering a target.

(Step 4: Purge and Exhaust in the Processing Chamber)

After the plasma generation is stopped by turning off the high frequency power supply 23b, the purge gas supply and the vacuum evacuation are performed as in the step 2 to remove molecules and atoms that are not adsorbed on the barrier layer 62 from the processing chamber 2.

Figure 3B:
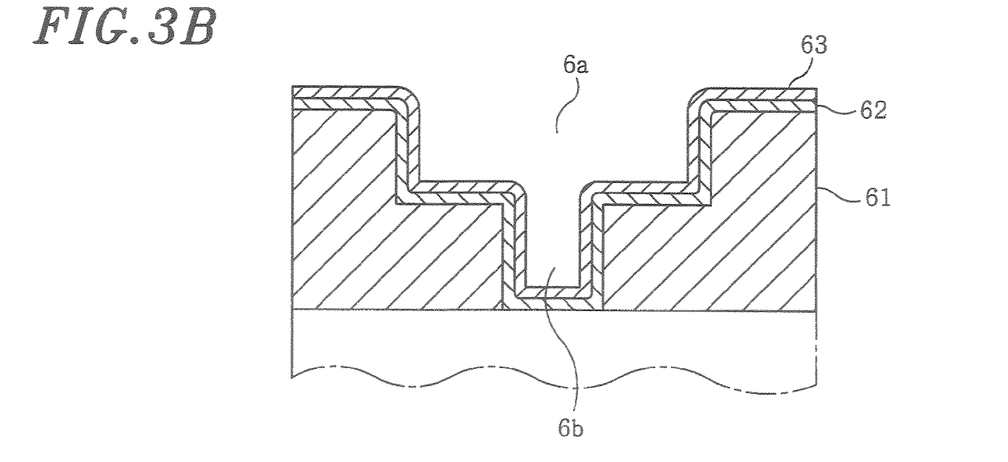
Figure 3C:
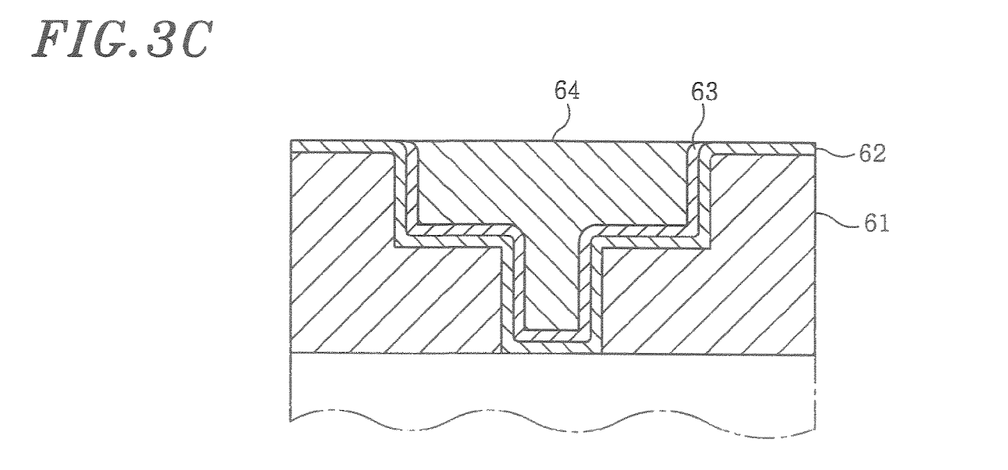
Figure 4D:
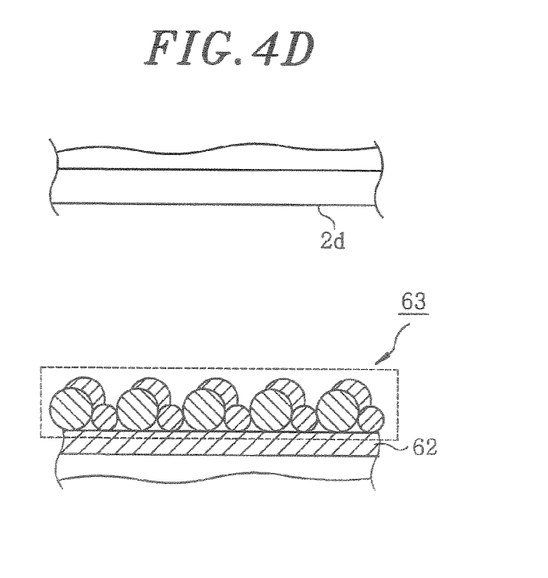
Figure 5A:
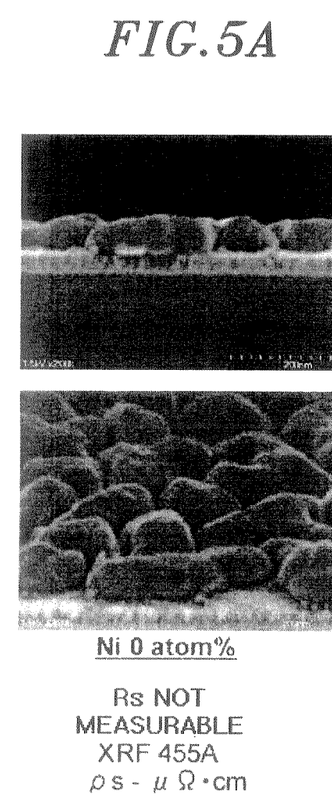
FIGS. 5A to 5D offer enlarged views of a metal layer formed on a surface of a wafer W by the film forming apparatus.
Figure 5B:
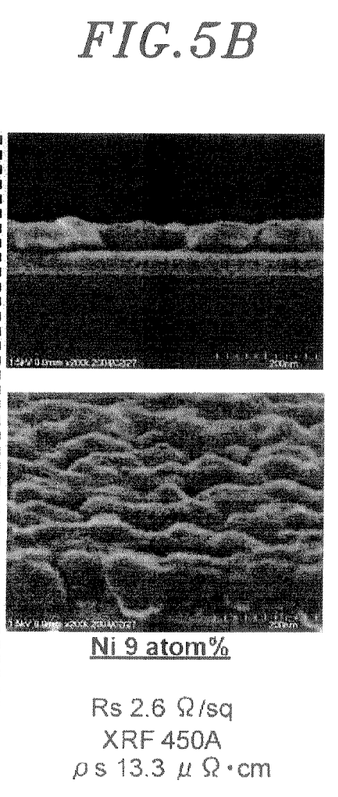
Figure 5C:
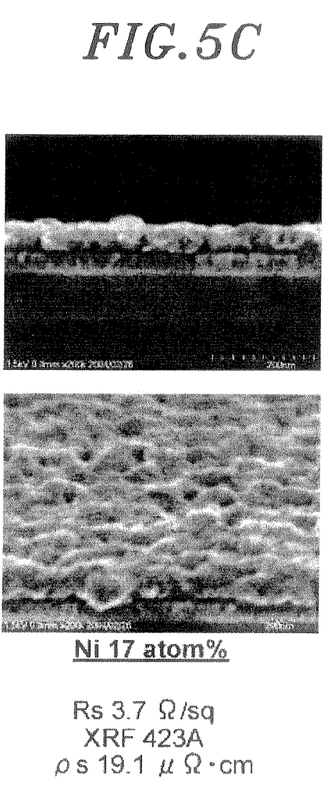
Figure 5D:
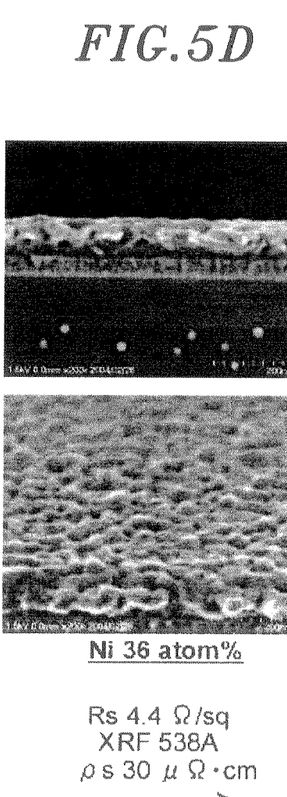

Each of the steps 1 to 4 is performed for, e.g., one second. Then, a series of the steps 1 to 4 is executed repeatedly until a seed layer 63 is formed by completely covering the surface of the barrier layer 62 with the Cu atoms 7a and the Ni atoms 73, i.e., a Cu—Ni alloy layer, as shown in FIG. 4D. For example, the steps 1 to 4 are performed repeatedly about 5 to 100 times, and the resulting thickness of the seed layer 63 may be about 5 nm to about 10 nm, for example. FIGS. 3A to 3C show the seed layer 63 being formed over the wiring groove 6a and the via hole 6b. Thereafter, Cu is attached to the surface of the wafer by an electroplating method to fill the recess including the wiring groove 6a and the via hole 6b. Next, by planarizing the surface of the wafer W through a CMP process, a Cu wiring 64 is formed, as shown in FIG. 3C.

In accordance with the aforementioned embodiment, the Cu atoms reduced from a Cu compound can reach even a bottom portion of a recess having a high aspect ratio because the Cu atoms are attached to an inside of the recess by using an ALD (atomic layer deposition) method for adsorbing a molecular layer of the Cu compound on the surface of the wafer W. Further the Ni atoms are adhered to the Cu layer by the sputtering and then diffused via the Cu layer until they reach the bottom surface of the recess, so that a seed layer formed of a Cu—Ni alloy layer can be formed with a good step coverage.

When the Cu atoms are coupled with the Ni atoms to form an alloy, a movement of the Cu atoms is suppressed by the Ni atoms. Therefore, an aggregation of the Cu atoms and an island-shaped growth of the Cu molecules are also suppressed, thereby allowing the seed layer 63 to be formed as a continuous film. Accordingly, when the wiring 64 is formed by burying Cu, occurrence of voids in the wiring 64 is suppressed and, hence, high reliability in the wiring 64 can be obtained. In the above-described example, the Cu(edmdd)2 molecules 7 are reduced by using H2 gas, serving as a reducing gas, and plasma energy. However, the energy supplied to the reactant is not limited to the plasma energy, that is, it can also be thermal energy obtained by heating the wafer W to a temperature required for reduction, light energy obtained by irradiating light or the like.

Moreover, in the above-described example, the Ni atoms annealed by heating the wafer W are diffused into the recess. However, heating the wafer W to anneal the Ni atoms is not a required condition. The Ni atoms can be annealed by heating the wafer W after completing a series of the steps or by irradiating laser beams to the water W. In this embodiment, by injecting the sputtered Ni atoms into the Cu layer, the Ni atoms are diffused even into a deep portion of the recess via the Cu layer, which is different from a case of forming a seed layer of Cu by a sputtering. That is, this embodiment is achieved by combining the reduction process of the Cu(edmdd)2 molecules 7 and the Ni sputtering process.

In this embodiment, a film was formed by using Cu as the first metal. However, the first metal is not limited to the Cu, and can be selected among Ti (titan), Sn (tin), W (tungsten), Ta (tantalum), Mg (magnesium), In (indium), Al (aluminum), Ag (argentum), Co (cobalt), Nb (niobium), B (boron), V (vanadium), Mn (manganese) or the like. The second metal can also be selected from those metals without being limited to the Ni used in this embodiment. As for the second metal, it is preferable to use a metal having a melting point higher than or equal to that of the first metal to thereby effectively suppress the aggregation between the first metal atoms. In addition, the seed layer 63 can be formed of an alloy including at least three metals, instead of an alloy having two metals such as, e.g., Cu and Ni. For example, an alloy including three metals can be formed on the surface of the wafer W by adhering a third metal to the wafer surface on which the second metal is adhered. In this case, the vacuum evacuation is performed between a second metal adhesion process and a third metal adhesion process.

In this embodiment, the upper electrode facing the mounting table 3 serves as the gas shower head for supplying gases. However, it is also possible to provide gas supply ports, in addition to the upper electrode, on a sidewall of the reaction chamber 2. Moreover, the upper electrode as a target electrode can be made of the second metal instead of having a bottom surface of the upper electrode pre-coated with the second metal. In case the pre-coated portion is consumed the second metal can be pre-coated thereon again and, hence, it is unnecessary to replace the entire electrode. This embodiment is not only applied to a case of forming a seed layer but also to a case of forming an entire wiring layer or an alloy thin film. Further, the target electrode may be different from an electrode where the reducing gas and the sputtering gas are converted into a plasma. In this case, there can be employed a configuration in which the target electrode is disposed to face the mounting table in, e.g., an inductively coupled plasma type apparatus.

TEST EXAMPLES

In order to check the effects of the present invention, a seed layer was formed on a surface of a bare silicon wafer by using the film forming apparatus of the above-described embodiment. As for a compound of a first metal, there was used Cu(edmdd)2. As for a second metal, Ni was used. A reducing plasma was generated by using H2 gas as a reducing gas. A sputtering plasma was generated by using Ar gas as a sputtering gas. The test was carried out while changing sputtering conditions and maintaining conditions for forming a Cu layer. As a result, three seed layers were formed. The three seed layers have Ni contents (atom %) of 9 atom %, 17 atom % and 36 atom % and are a first, a second and a third test examples, respectively. Meanwhile, a seed layer where the Ni sputtering process has not been carried out (Ni content of 0 atom %) was provided as a comparative example. Then, images of wafer surfaces in each of the examples were captured by using a scanning electron microscope (SEM).

FIGS. 5A to 5D illustrate the captured images of the comparative example and the first to the third test examples. By using a four-point probe method, sheet resistances (Rs (unit: $\Omega$/sq)) of the seed layers in the first to the third test example and the comparative example were measured. Then, resistivities ($\rho$s (unit: $\mu\Omega\cdot$cm)) were calculated by using the sheet resistances and film thicknesses obtained by an X-ray fluorescent (XRF) analysis. FIGS. 5A to 5D show the results thereof.

Referring to FIGS. 5A to 5D, images in an upper row depict wafer surfaces seen from a side, whereas those in a lower row provide enlarged views of the wafer surfaces. As can be seen from FIGS. 5B to 5D, the wafer surfaces in the test examples are densely coated with the metals. On the other hand, as can be seen from FIG. 5A, the wafer surface in the comparative example has discontinuities due to large molecules formed of the Cu atoms aggregated to one another. As illustrated in FIGS. 5A to 5D, the sheet resistances of the wafers in the test examples were measurable, whereas that of the wafer in the comparative example was not measurable. This indicates that the seed layers of the text examples were continuous films, whereas that of the comparative example was a discontinuous one. Accordingly, it proved that the method and the apparatus of the present invention are capable of suppressing the occurrence of discontinuities in the seed layer. Although a semiconductor wafer was used as a substrate in this test example, it is also possible to use an LCD substrate, a glass substrate, a ceramic substrate or the like.

What is claimed is:
1. A film forming method, comprising:
a mounting step of mounting a substrate on a mounting member after loading the substrate into a reaction chamber;

an adsorbing step of adsorbing a compound of a first metal on a surface of the substrate by supplying a source gas containing the compound of the first metal into the reaction chamber;

a reducing step of reducing the compound of the first metal adsorbed on the substrate by making a reducing gas contact therewith while supplying energy for a reducing reaction to the compound, to thereby obtain a first metal layer; and an alloying step of alloying the first metal and a second metal to obtain an alloy layer of the first metal and the second metal by injecting the second metal into the first metal layer, the second metal being ejected from a target electrode facing the substrate by making a sputtering plasma contact with the target electrode, the sputtering plasma being obtained by activating a sputtering gas, and at least a surface of the target electrode being formed of the second metal different from the first metal, wherein one or more cycles are performed repeatedly, each cycle including the adsorbing step, the reducing step and the alloying step, wherein the reducing step and the alloying step are simultaneously performed after the adsorbing step, so that occurrence of discontinuities in the alloy layer due to aggregation of the first metal is suppressed, and wherein the target electrode is pre-coated with a layer of the second metal and the second metal has a melting point higher than or equal to a melting point of the first metal.

2. The film forming method of claim 1, wherein the alloying step is performed while heating the substrate such that the second metal is annealed and diffused via a surface of the first metal.

3. The film forming method of claim 1, wherein the energy for the reducing reaction supplied to the compound during the reducing step for obtaining the first metal layer is at least one of energy of a reducing plasma, thermal energy and light energy, the reducing plasma being obtained by activating the reducing gas.

4. The film forming method of claim 1, wherein the reducing step and the adsorbing step are performed by applying a high frequency voltage to a gap between parallel plate electrodes, one electrode serving as the substrate mounting member and the other electrode serving as the target electrode.

5. The film forming method of claim 4, wherein the other electrode has a plurality of gas supply openings for supplying the source gas, the reducing gas, and the sputtering gas into the reaction chamber.

6. The film forming method of claim 1, further comprising, after the adsorbing step, the step of evacuating an inside of the reaction chamber.

7. The film forming method of claim 1, wherein two or more cycles are performed repeatedly, and an inside of the reaction chamber is evacuated between every two neighboring cycles.

8. The film forming method of claim 1, wherein the reducing gas is $H_2$ gas or $NH_3$ gas.

9. The film forming method of claim 1, wherein the first metal is copper.

10. The film forming method of claim 1, wherein the alloy layer of the first metal and the second metal is a seed layer in a recess formed on the surface of the substrate.

11. The film forming method of claim 1, wherein the compound of the first metal is Cu(edmdd)2.

12. The film forming method of claim 1, wherein the first metal is selected from the group consisting of Cu, Ti, Sn, W, Ta, Mg, In, Al, Ag, Co, Nb, B, V and Mn.

13. The film forming method of claim 1, wherein the second metal is Ni.

14. The film forming method of claim 1, wherein the reducing step and the alloying step are simultaneously performed by making the sputtering plasma contact with both of the target electrode and the substrate, the sputtering gas including the reducing gas.

15. The film forming method of claim 14, wherein the sputtering gas includes Ar and the reducing gas includes $H_2$.

16. A film forming method, comprising:

a mounting step of mounting a substrate on a mounting member after loading the substrate into a reaction chamber;

an adsorbing step of adsorbing a compound of a first metal on a surface of the substrate while the substrate is on the mounting member by supplying a source gas containing the compound of the first metal into the reaction chamber;

while the substrate is on the mounting member, a reducing step of reducing the compound of the first metal adsorbed on the substrate by making a reducing gas contact therewith while supplying energy for a reducing reaction to the compound, to thereby obtain a first metal layer; and while the substrate is on the mounting member, an alloying step of alloying the first metal and a second metal to obtain an alloy layer of the first metal and the second metal by injecting the second metal into the first metal layer, the second metal being ejected from a target electrode facing the substrate by making a sputtering plasma contact with the target electrode, the sputtering plasma being obtained by activating a sputtering gas, and at least a surface of the target electrode being formed of the second metal different from the first metal, wherein one or more cycles are performed repeatedly, each cycle including the adsorbing step, the reducing step and the alloying step, wherein the reducing step and the alloying step are simultaneously performed after the adsorbing step, so that occurrence of discontinuities in the alloy layer due to aggregation of the first metal is suppressed, and wherein the target electrode is pre-coated with a layer of the second metal, and the second metal has a melting point higher than or equal to a melting point of the first metal.

* * * * *